United States Patent [19]

Shikata et al.

[11] Patent Number: 4,939,384

[45] Date of Patent: Jul. 3, 1990

[54] FLIP-FLOP CIRCUIT

[75] Inventors: Makoto Shikata; Koutaro Tanaka; Masahiro Akiyama; Yasushi Kawakami, all of Tokyo, Japan

[73] Assignee: Oki Electric Industry Co., Ltd, Tokyo, Japan

[21] Appl. No.: 253,219

[22] Filed: Oct. 3, 1988

[51] Int. Cl.$^5$ .......................... H03K 3/26; H03K 3/29; H03K 3/284

[52] U.S. Cl. ................................. 307/279; 307/289; 307/291; 307/272.1; 307/272.2

[58] Field of Search ............ 307/279, 289, 291, 272 R, 307/272 A

[56] References Cited

U.S. PATENT DOCUMENTS 3,845,325 10/1974 Daniels et al. ............... 307/279
4,300,060 11/1981 Yu ............................. 307/279
4,568,843 2/1986 Gloanec et al. ................ 307/279

FOREIGN PATENT DOCUMENTS 0103511 5/1988 Japan ............................ 307/289

OTHER PUBLICATIONS

IEEE Electron Device Letters vol. EDL-6 No. 2, pp. 83–85, 1985 "High Frequency Divider Circuits Using Ion Implanted GaAs MESFET's".

IEEE Electron Device Letters vol. EDL-5 No. 7 pp. 226–227, 1984 "A monolithic Multigigabit/Second DCFL GaAs Decision circuit".

Primary Examiner—Stanley D. Miller
Assistant Examiner—Trong Quang Phan
Attorney, Agent, or Firm—Wenderoth, Lind & Ponack

[57] ABSTRACT

A flip-flop circuit comprises two basic flip-flop circuits, four field effect transistors, and four amplifiers. The two basic flip-flop circuits respectively composed of a first and a second inverter circuits, and an output terminal of the first inverter circuit is connected to an input terminal of the second inverter circuit and an output terminal of the second inverter circuit is connected to the input terminal of the first inverter circuit. The field effect transistors have sources respectively connected to input terminals of the two basic flip-flop circuits, and gates to which clock pulses and inverse clock pulses are applied. The amplifiers respectively composed of an inverter circuit are connected to output terminals of the two basic flip-flop circuits.

1 Claim, 4 Drawing Sheets

FLIP-FLOP CIRCUIT

BACKGROUND OF THE INVENTION

1. Field of the Invention:

The present invention relates to a flip-flop circuit, more particularly to a data flip-flop circuit and T flip-flop circuit.

2. Description of the Prior Art:

The prior flip-flop circuit of this sort is disclosed, for example in "DESIGN OF FLIP-FLOP CIRCUIT AND COUNTER CIRCUIT" in pp 84–89 published by Tokyo Electrical Engineering College. The prior flip-flop circuit will be described hereafter with reference to FIGS. 3 and 4.

A D flip-flop circuit shown in FIG. 3 comprises 6 NOR gates 31 through 36. Designated at CL is an input terminal of clock pulse (hereafter referred to as a clock pulse terminal). D, $\overline{D}$ denote respectively data pulse input terminal and inverse data pulse input terminal (hereafter referred to as data terminals), Q and $\overline{Q}$ denote respectively output terminal and inverse output terminal. FIG. 4 shows waveforms for assistance in explanation of the operation of the flip-flop circuit in which the output terminal Q is connected to the inverse data input terminal $\overline{D}$, and the inverse output terminal $\overline{Q}$ is connected to the data input terminal D as shown in dotted line in FIG. 3 constituting a T flip-flop circuit. An axis of abscissa shows times t1–t5 while an axis of ordinate shows logical output levels respectively at the clock pulse terminal CL, nodes N1–N4, the output terminal Q, and the inverse terminal $\overline{Q}$.

Assuming that at the time of t0, a clock pulse at the clock pulse terminal CL (hereafter referred to as clock pulse) is high level (hereafter referred to as H) an output condition at the output terminal Q (hereafter referred to as Q output) is low level (hereafter referred to as L), and an output condition at the inverse output terminal $\overline{Q}$ (hereafter referred to as Q output) is H. Output conditions at the nodes N2, N3 (hereafter referred to respectively N2, N3 output) are respectively forced to L since the clock pulse goes H. The output condition at the node N1 (hereafter referred to as N1 output) is forced to H since the Q output and the N2 output are respectively L. An output condition at the node N4 (hereafter referred to as N4 output) is forced to H since the $\overline{Q}$ output is H. The flip-flop circuit is stable at this state.

When the clock pulse goes L at the time of t1, N2 output is determined by the N1 output since the clock pulse and the N3 output are respectively L. Similarly, the N3 output goes H since the N4 output is L at the time of t1. The $\overline{Q}$ output changes L while the N3 output is H to thereby cause the Q output to change H since the N2 output and the $\overline{Q}$ output respectively change L. The N1 output changes L since Q output is H. The N4 output changes L since the N3 output is H. The flip-flop circuit is stable at this state.

Subsequently, when the clock pulse goes H at the time of t2, the N2 output and the N3 output are respectively L. Hence, the Q output and the $\overline{Q}$ output do not change. While the N1 output is kept L, the N4 output changes H since the N3 output and the $\overline{Q}$ output are respectively L. The flip-flop circuit is stable at this state.

Still subsequently, when the clock pulse goes L at the time of t3, the N2 output is determined by the N1 output. The N2 output changes H since the N1 output is L. The N3 output is determined by the N4 output. The N3 changes H since the N4 output is H. The Q output changes L since the N2 output changes H while $\overline{Q}$ output changes H since both the Q output and the N3 output change L respectively. While the N1 output is kept L since the N2 output changes H, the N4 output changes L since the $\overline{Q}$ changes H. The flip-flop circuit is stable at this state.

Still subsequently furthermore, when the clock pulse goes H at the time of t4, the N2 output and the N3 output change respectively L whereby the Q output and the $\overline{Q}$ output do not change. The N1 output changes H since the Q output and N2 output respectively change L. The N4 output is kept L since the $\overline{Q}$ output is H. The flip-flop circuit at the time of t4 changes same state as that at that time of t0, namely to be stable.

As described above, the prior T flip-flop circuit is employed as a frequency divider enabling to effect ½ frequency dividing operation in which the Q output repeats an operation to switch L or H at the trailing edge of the clock pulse. When the N1 output is, for example, H, a critical path is constituted by the path starting from the node N1, passing through the node 4, the NOR gate 32, the node N2, the NOR gate 35, the NOR gate 36, and reaching the NOR gate 34. A frequency where the flip-flop circuit operates at maximum speed is determined by a delay time characteristic in the critical path.

However, the prior flip-flop circuit has a shortcoming that a delivering delay time is increased since the NOR gates 32, 33 have respectively three fun-outs. Furthermore, inasmuch as many NOR gates are employed in the flip flop circuit, the delay time is increased as a whole of the circuit. Accordingly, the prior flip-flop circuit can not effect as the frequency divider when the input clock pulse is a high frequency.

SUMMARY OF THE INVENTION

It is an object of the present invention to provide a flip-flop circuit enabling to operate ordinarily even if an input clock pulse is a high frequency.

The flip-flop circuit according to the present invention comprises a first and a second basic flip-flop circuits each composed of two inverter circuits respectively having an output terminal being connected to an input terminal of the other inverter circuit; first two field effect transistors each having a source connected to the input terminal of each inverter circuit of the first basic flip-flop circuit, a drain connected respectively to a data input terminal and an inverse data input terminal, and a gate to which inverse clock pulses are applied; second two field effect transistors each having a source connected to the input terminal of each inverter circuit of the second basic flip-flop circuit, and a gate to which clock pulses are applied; first two amplifiers each composed of an inverter circuit having an input terminal connected to each source of the first two field effect transistors, and an output terminal connected to each drain of the second field effect transistors; and second two amplifiers each composed of an inverter circuit having an input terminal connected to each source of the second two field effect transistors, an output terminal and an inverse output terminal respectively connected to each drain of the first two field effect transistors.

The above and other objects, features and advantages of the present invention will become more apparent from the following description taken in conjunction with the accompanying drawings.

DESCRIPTION OF THE PREFERRED EMBODIMENT

Figure 1:
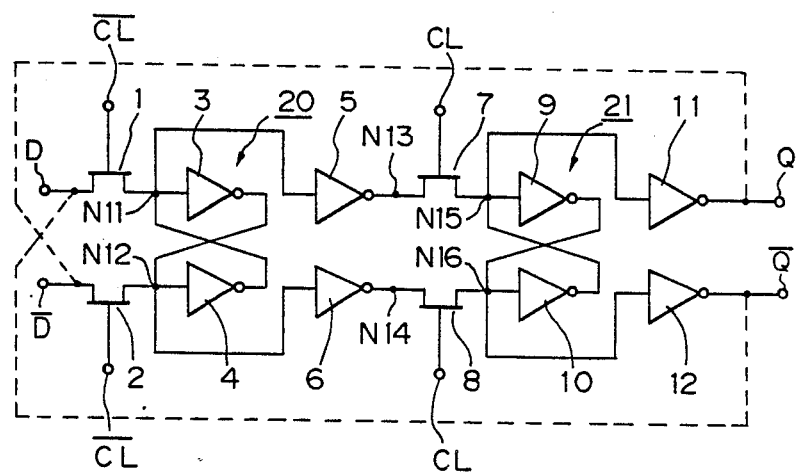
FIG. 1 is a flip-flop circuit according to an embodiment of the present invention.
Figure 2:
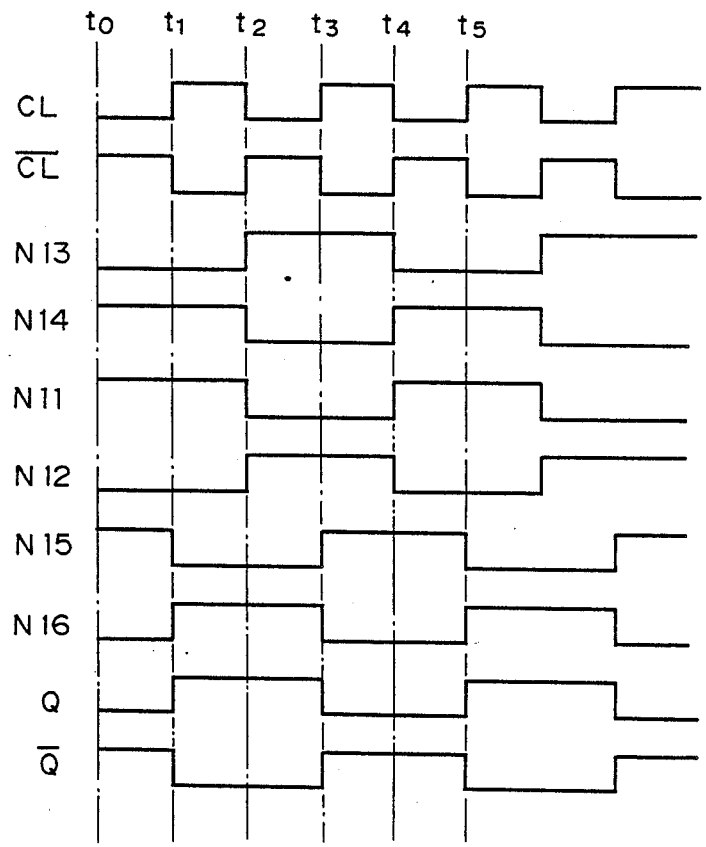
FIG. 2 is waveforms for assistance in explanation of the operation of the flip-flop circuit of the embodiment in FIG. 1.
Figure 3:
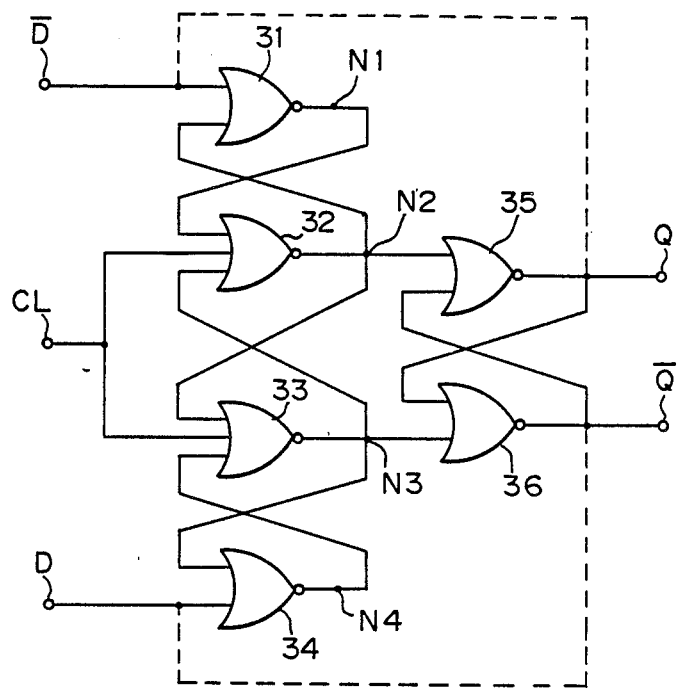
FIG. 3 is a prior flip-flop circuit.
Figure 4:
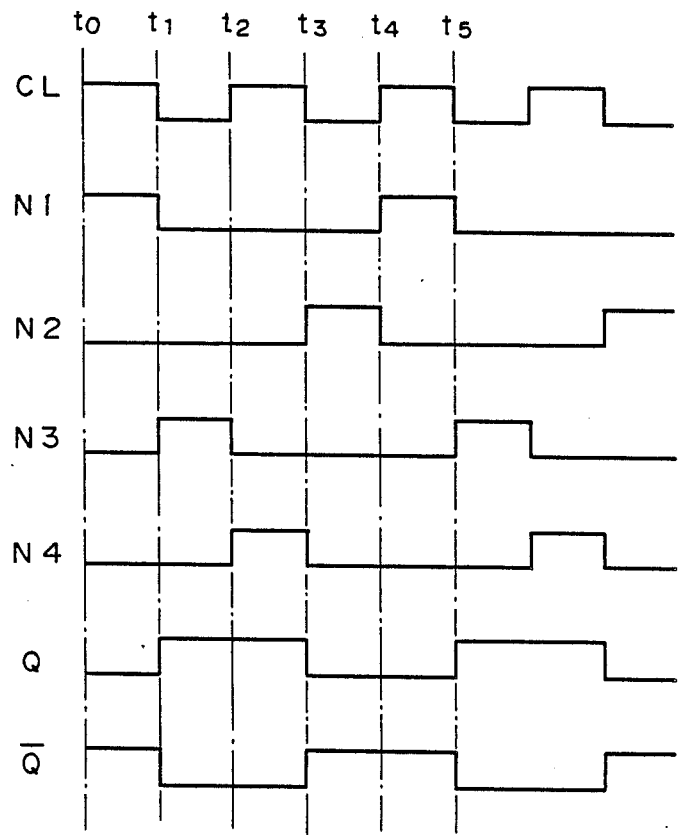
FIG. 4 is waveforms for assistance in explanation of the operation of the prior flip-flop circuit in FIG. 3.

A flip-flop circuit according to an embodiment of the present invention will be described with reference to FIGS. 1 and 2.

The flip-flop circuit includes a clock pulse input terminal CL, an inverse clock pulse input terminal $\overline{CL}$, a data input terminal D, an inverse data input terminal $\overline{D}$, an output terminal Q, and an inverse output terminal $\overline{Q}$. The flip-flop circuit further includes two basic flip-flop circuits 20, 21 composed of respectively two inverter circuits 3, 4, 9, 10, four amplifiers 5, 6, 11, 12 respectively composed of an inverter circuit, four field effect transistors 1, 2, 7, 8 (hereafter referred to as FET) between the data input D, the inverse data input terminal $\overline{D}$ and the output terminal Q and the inverse output terminal $\overline{Q}$.

The data input terminal D is connected to a drain of the FET 1, the inverse data input terminal $\overline{D}$ is connected to a drain of the FET 2. A source of FET 1 is respectively connected to an input terminal of the inverter circuit 3 constituting a first basic flip-flop circuit 20 and an input terminal of the amplifier 5. A source of the FET 2 is respectively connected to an input terminal of the inverter circuit 4 of the first basic flip-flop circuit 20 and an input terminal of the amplifier 6. An output of the inverter circuit 3 is fedback into the input terminal of the inverter circuit 4 while an output of the inverter circuit 4 is fedback into the input terminal of the inverter circuit 3. An output terminal of the amplifier 5 is connected to a drain of the FET 7 and an output teminal of the amplifier 6 is connected to a drain of the FET 8.

A source of the FET 7 is respectively connected to an input terminal of the inverter circuit 9 constituting a second basic flip-flop circuit 21 and an input terminal of the amplifier 11. A source of the FET 8 is respectively connected to an input terminal of the inverter circuit 10 of the second basic flip-flop circuit 21 and an input terminal of the amplifier 12. An output of the inverter circuit 9 is fedback into the input terminal of the inverter circuit 10 while an output of the inverter circuit 10 is fedback into the input terminal of the inverter circuit 9. An output of the amplifier 11 is connected to the output terminal Q and an output of the amplifier 12 is connected to the inverse output terminal $\overline{Q}$. The clock pulse input terminals CL are respectively connected to a gate of the FET 7 and a gate of the FET 8. The inverse clock pulse input terminals CL are respectively connected to a gate of the FET 1 and a gate of the FET 2.

An operation of the flip-flop circuit in which the output of the amplifier 11 is connected to the drain of the FET 2 and the output of the amplifier 12 is connected to the drain of the FET 1 as shown in the dotted lines in FIG. 1 will be described hereafter with reference to FIG. 2.

An axis of abscissa shows the times t0-t5 and an axis of ordinate shows logical output levels respectively at the clock pulse input terminal CL, the inverse clock pulse input terminal $\overline{CL}$, the nodes N11-N16, the output terminal 9, and the inverse output terminal 9.

Let us assume that at the time of t0 a clock pulse at the clock pulse terminal CL (hereafter referred to as clock pulse) is L and a clock pulse at the inverse clock pulse terminal $\overline{CL}$ (hereafter referred to as inverse clock pulse) is H, an output condition at the node N11 (hereafter referred to as N11 output) is H, an output condition at the node N12 (hereafter referred to as N12 output) is L, an output condition at the node N13 (hereafter referred to as N13 output) is L, an output condition at the node N14 (hereafter referred to as N14 output) is H, an output condition at the node N15 (hereafter referred to as N15 output) is H, an output condition at the node N16 (hereafter referred to as N16 output) is L, an output condition at the output terminal Q (hereafter referred to as Q output) is L, and an output condition at the inverted output terminal $\overline{Q}$ (hereafter referred to as $\overline{Q}$ output) is H.

At the time of t1 when the clock pulse goes H and the inverse clock pulse goes L the FETs 1 and 2 are respectively not conducted whereby the N15 output is forced to L and the N16 output is forced to H. Accordingly the Q output changes H and the $\overline{Q}$ output changes L. The N11 output through N14 output do not change.

Successively, at the time of t2 when the clock pulse goes L and the inverse clock pulse goes H the FETs 1 and 2 are conducted and the FETs 7 and 8 to be conducted whereby the N11 output is forced to L, N12 output to H, N13 output to H, and N14 output to L. However the N15 output, the N16 output, the Q output and the $\overline{Q}$ output do not change.

Further successively at the time of t3, when the clock pulse goes H and the inverse clock pulse goes L, the N15 output is forced to H, the N16 output to L, the $\overline{Q}$ output to L and Q output to H. However, the N11 output through N14 output do not change.

Still furthermore successively, at the time of t4, when the clock pulse goes L, and the inverse clock pulse goes H, the N11 output is forced to H, the N12 output to L, the N13 output to L, and the N14 output to H. However, the N15 output and the N16 output, Q output and the $\overline{Q}$ output do not change. At the time of t4, the flip-flop circuit is returned to same state as in the time of t0.

A critical path according to the present flip-flop circuit constituted by the path starting from the data input terminal D, passing through the output terminal Q, the FET 1, the node N11, the inverter circuit 3, the node N13, the FET 7, the node N15, the amplifier 11. A maximum operation frequency is decided by a delivery delay time characteristic of the FET 1, the amplifier 5, the FET 7, and the amplifier 11.

As explained in detail above, a number of fun-out of the FET and the inverter on the critical path is less than the number of fun-out of the NOR gate in the prior flip-flop circuit. Accordingly, the maximum operation frequency can be increased since the delivery delay time is shortened. For example, a simulation carried out by the computer revealed that the flip-flop circuit according to the present invention can operate at the frequency 1.5 times of that in the prior flip-flop circuit. Furthermore, design of driving capacity of the amplifier is flexibly increased in comparison with the inverter circuit constituting the prior basic flip-flop circuit.

When the flip-flop circuit is a D flip-flop circuit, the FETs 2, 8 and the amplifiers 6, 12 can be eliminated. When the flip-flop circuit is T flip-flop circuit, the FETs 2, 8 and the amplifiers 6, 11 are not necessitited. Furthermore the input terminals of the amplifiers 5, 6, 11, 12 can be respectively connected to the output terminals of the inverter circuits 3, 4, 9, and 10.

Although the invention has been described in its preferred form with a certain degree of particularity, it is to be understood that many variations and changes are possible in the invention without departing from the scope thereof.

What is claimed is:

1. A flip-flop circuit comprising:
  (a) a first and a second basic flip-flop circuits each composed of two inverter circuits respectively having an output terminal being connected to an input terminal of the other inverter circuit;
  (b) first two field effect transistors each having a source connected to the input terminal of each inverter circuit of the first basic flip-flop circuit, a drain connected respectively to a data input terminal and an inverse data input terminal, and a gate to which inverse clock pulses are applied;
  (c) second two field effect transistors each having a source connected to the input terminal of each inverter circuit of the second basic flip-flop circuit, and a gate to which clock pulses are applied;
  (d) first two amplifiers each composed of an inverter circuit having an input terminal connected to each source of the first two field effect transistors, and an output terminal connected to each drain of the second field effect transistors; and
  (e) second two amplifiers each composed of an inverter circuit having an input terminal connected to each source of the second two field effect transistors, an output terminal and an inverse output terminal respectively connected to each drain of the first two field effect transistors.

* * * * *